United States Patent
Lee et al.

(10) Patent No.: US 11,502,273 B2
(45) Date of Patent: Nov. 15, 2022

(54) DISPLAY PANEL AND DISPLAY DEVICE INCLUDING DISPLAY PANEL

(71) Applicant: SAMSUNG DISPLAY CO., LTD., Yongin-si (KR)

(72) Inventors: Joongeol Lee, Yongin-si (KR); Kyeongsu Ko, Yongin-si (KR); Sanggab Kim, Yongin-si (KR); Shinil Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/229,223

(22) Filed: Apr. 13, 2021

(65) Prior Publication Data

US 2021/0242424 A1 Aug. 5, 2021

Related U.S. Application Data

(63) Continuation of application No. 16/440,668, filed on Jun. 13, 2019, now Pat. No. 10,978,672.

(30) Foreign Application Priority Data

Jun. 29, 2018 (KR) .................. 10-2018-0076085

(51) Int. Cl.
*H01L 27/32* (2006.01)
*H01L 51/52* (2006.01)
*H01L 51/00* (2006.01)

(52) U.S. Cl.
CPC ...... *H01L 51/5253* (2013.01); *H01L 27/3244* (2013.01); *H01L 51/0096* (2013.01)

(58) Field of Classification Search
CPC ............. H01L 27/3244; H01L 51/5253; H01L 51/0096

(Continued)

(56) References Cited

U.S. PATENT DOCUMENTS

| 10,454,067 B2 | 10/2019 | Seo et al. |
| 2016/0260928 A1 | 9/2016 | Choi et al. |

(Continued)

FOREIGN PATENT DOCUMENTS

| EP | 3 486 962 | 5/2019 |
| KR | 1020090068505 | 6/2009 |

(Continued)

OTHER PUBLICATIONS

Extended European Search Report dated Nov. 4, 2019 for European Application Serial No. 19182206.3.

*Primary Examiner* — Igwe U Anya
(74) *Attorney, Agent, or Firm* — F. Chau & Associates, LLC

(57) ABSTRACT

A display panel includes a substrate having an opening area, and a display area at least partially surrounding the opening area. Display elements are arranged in the display area. The display elements includes a pixel electrode, an opposite electrode, and an intermediate layer interposed therebetween. A multilayer film includes a first insulating layer between the substrate and the pixel electrode and a second insulating layer, of a different material, on the first insulating layer. A thin film encapsulation layer covers the display elements and includes at least one organic encapsulation layer and at least one inorganic encapsulation layer. The multilayer film includes a first groove disposed between the opening area and the display area. The first groove has an undercut structure in which a lower width of the first groove is greater than an upper width of the first groove.

14 Claims, 16 Drawing Sheets

(58) Field of Classification Search
USPC .......................................................... 257/40
See application file for complete search history.

(56) References Cited

U.S. PATENT DOCUMENTS

| 2017/0031323 | A1 | 2/2017 | Kim et al. |
| 2017/0148856 | A1* | 5/2017 | Choi ................... H01L 27/3258 |
| 2017/0288004 | A1 | 10/2017 | Kim et al. |
| 2017/8323779 | | 11/2017 | Um et al. |
| 2019/0148072 | A1 | 5/2019 | Seo et al. |
| 2019/0148469 | A1* | 5/2019 | Lhee ................... H01L 27/3279 |
| | | | 257/40 |
| 2020/6006701 | | 1/2020 | Lee et al. |
| 2022/0115474 | A1* | 4/2022 | Jia ........................... H01L 51/56 |

FOREIGN PATENT DOCUMENTS

| KR | 1020180013225 | 2/2016 |
| KR | 1020170059864 | 5/2017 |

* cited by examiner

DISPLAY PANEL AND DISPLAY DEVICE INCLUDING DISPLAY PANEL

CROSS-REFERENCE TO RELATED APPLICATION

This application is a Continuation of co-pending U.S. patent application Ser. No. 16/440,668, filed on Jun. 13, 2019, which claims the benefit of Korean Patent Application No. 10-2018-0076085, filed on. Jun. 29, 2018, in the Korean Intellectual Property Office, the disclosures of which are herein incorporated by reference in then entirety.

TECHNICAL FIELD

The present disclosure relates to a display device and, more specifically, to a display panel and a display device including the display panel.

DISCUSSION OF THE RELATED ART

In recent years, display devices are being used in a wider variety of products. In addition, display devices are becoming thinner and lighter weight, and thus the range of use thereof is increasing.

While a display area of a display device is increased, a wide range of sensors and other elements are being integrated into the display device.

SUMMARY

A display panel includes a substrate having an opening area, and a display area at least partially surrounding the opening area. A plurality of display elements is arranged in the display area. Each of the plurality of display elements includes a pixel electrode, an opposite electrode, and an intermediate layer interposed between the pixel electrode and the opposite electrode. A multilayer film includes a first insulating layer arranged between the substrate and the pixel electrode and a second insulating layer arranged on the first insulating layer and having a material different from that of the first insulating layer. A thin film encapsulation layer covers the plurality of display elements and includes at least one organic encapsulation layer and at least one inorganic encapsulation layer. The multilayer film includes a first groove disposed between the opening area and the display area. The first groove has an undercut structure in which a lower width of the first groove is greater than an upper width of the first groove.

A display panel includes a substrate having an opening. A plurality of display elements is arranged on the substrate. The plurality of display elements surrounds the opening area. Each of the plurality of display elements includes a pixel electrode, an opposite electrode, and an intermediate layer interposed between the pixel electrode and the opposite electrode. A multilayer film includes a first insulating layer arranged between the substrate and the pixel electrode and a second insulating layer disposed on the first insulating layer. An encapsulating layer covers the plurality of display elements. The multilayer film includes a first groove that surrounds the opening and is concave with respect to a depth direction of the multilayer film. The first groove has an undercut structure in which a lower width of the first groove is greater than an upper width of the first groove.

A display device includes a substrate having an opening area and a display area at least partially surrounding the opening area. A plurality of display elements is arranged in the display area. Each display element includes a pixel electrode, an opposite electrode, and an intermediate layer interposed between the pixel electrode and the opposite electrode. A multilayer film includes an organic insulating layer disposed between the substrate and the pixel electrode and an inorganic insulating layer disposed on the organic insulating layer. A thin film encapsulation layer covers the plurality of display elements and includes at least one organic encapsulation layer and at least one inorganic encapsulation layer. The multilayer film includes a first groove that is located between the opening area and the display area. The first groove has an undercut structure.

BRIEF DESCRIPTION OF THE DRAWINGS

A more complete appreciation of the present disclosure and many of the attendant aspects thereof will be readily obtained as the same becomes better understood by reference to the following detailed description when considered in conjunction with the accompanying drawings in which.

DETAILED DESCRIPTION

Figure 1:
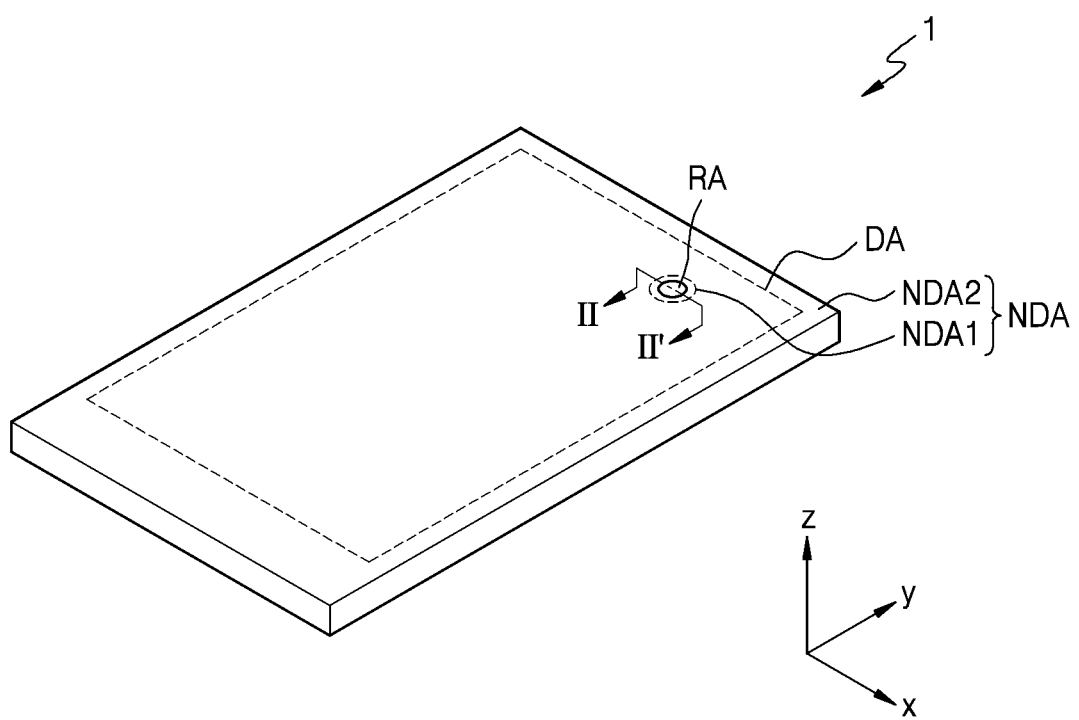
FIG. 1 is a perspective view schematically illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like elements may be referenced by like numerals throughout the specification and the drawings. To the extent that a detailed description of a particular element has been omitted, it may be assumed that the non-described element is at least similar to corresponding elements that have been described elsewhere within the specification.

While such terms as "first," "second," etc., may be used to describe various components, such components must not be limited to the above terms. The above terms are used only to distinguish one component from another.

In the embodiments below, it will be understood when a portion such as a layer, an area, or an element is referred to as being "on" or "above" another portion, it can be directly on or above the other portion, or intervening portion may also be present.

Sizes of components in the drawings may be exaggerated or contracted for convenience of explanation.

As described herein, when a layer, an area, or an element is said to be "connected" to another structure, it may be construed that the layer, area, or element is connected not only directly but also through other constituent elements interposed therebetween. For example, when a layer, an area, an element, or the like is described as being connected or electrically connected, the layer, the area, the element, or the like may be not only directly connected or directly electrically connected, but also connected through another layer, area, element, or the like interposed therebetween.

FIG. 1 is a perspective view schematically illustrating a display device 1 according to an exemplary embodiment of the present disclosure.

Referring to FIG. 1, the display device 1 includes a display area DA from which light is emitted and a non-display area NDA emitting no light. The display device 1 may display an image by using light emitted from a plurality of pixels arranged in the display area DA thereof.

The display device 1 includes an opening area RA that is at least partially surrounded by the display area DA. FIG. 1 illustrates that the opening area RA is fully surrounded by the display area DA. The non-display area NDA may include a first non-display area NDA1 surrounding the opening area RA (e.g. between the opening area RA and the display area DA) and a second non-display area NDA2 at least partially surrounding an outer portion of the display area DA. The first non-display area NDA1 may fully surround the opening area RA, the display area DA may fully surround the first non-display area NDA1, and the second non-display area NDA2 may fully surround the display area DA.

Hereinafter, an organic light-emitting display device (organic electroluminescent (EL) display) will be described as an example of the display device 1, according to an exemplary embodiment of the present disclosure, but the display device according to the present disclosure is not limited thereto. For example, various types of display devices such as an inorganic electroluminescent (EL) display, a quantum dot light emitting display or the like may be used.

FIGS. 2A through 2D are cross-sectional views schematically illustrating a display device 1 according to exemplary embodiments of the present disclosure, and may correspond to a cross-section cut along line II-II' of FIG. 1.

Figure 2A:
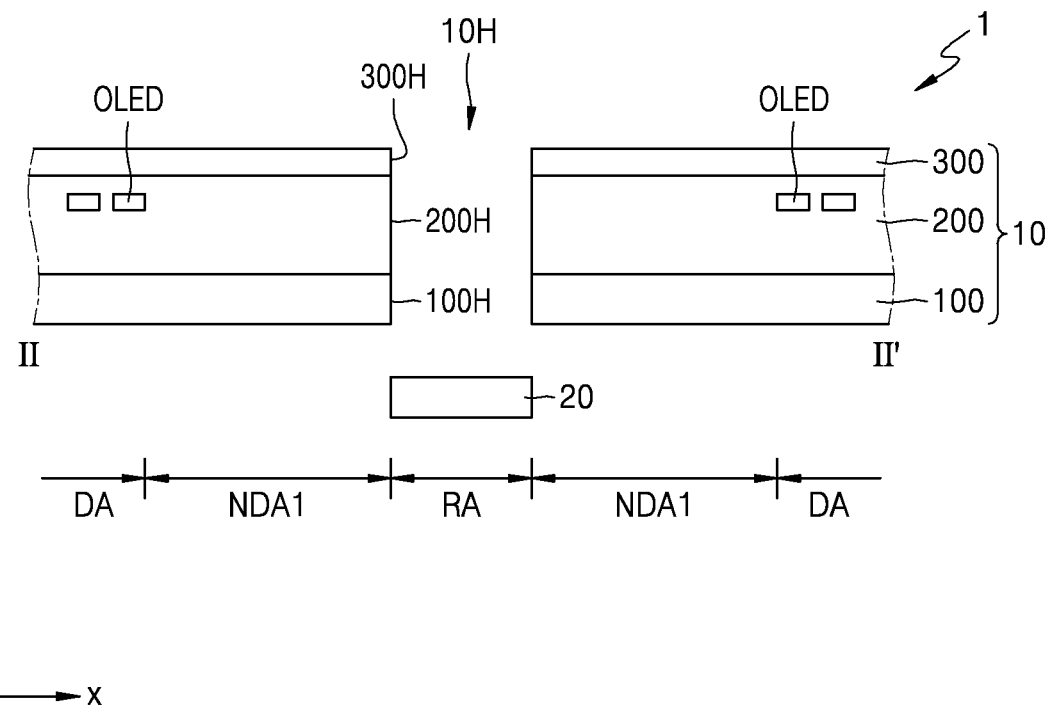
FIGS. 2A through 2D are schematic cross-sectional views illustrating a display device according to exemplary embodiments of the present disclosure.

Referring to FIG. 2A, the display device 1 may include a display panel 10 and an electronic element 20 corresponding to the opening area RA of the display panel 10. Various element(s) such as an input sensing member sensing a touch input, an anti-reflective member including a polarizer and a retarder or a color filter and a black matrix, and a transparent window may be further arranged on the display panel 10.

The display panel 10 may include a substrate 100, a display element layer 200 arranged on the substrate 100 and including display elements, and a thin film encapsulation layer 300, for example, an encapsulation member, covering the display element layer 200.

The substrate 100 may include a glass material containing $SiO_2$ as a main component. The display element layer 200 includes display elements such as an organic light-emitting diode OLED arranged in the display area DA. The display element layer 200 may include various circuits and wirings that are electrically connected to the organic light-emitting diode OLED which is a display element. The thin film encapsulation layer 300 may cover the display element layer 200, thereby preventing penetration of moisture or other external pollutants from passing into the display element layer 200. The thin film encapsulation layer 300 may include at least one inorganic encapsulation layer and at least one organic encapsulation layer.

The display panel 10 may include an opening 10H corresponding to the opening area RA and passing through the display panel 10 as illustrated in FIG. 2A. The substrate 100, the display element layer 200, and the thin film encapsulation layer 300 may respectively include first through third openings 100H, 200H, and 300H which correspond to the opening area RA. The first through third openings 100H, 200H, and 300H may together form the opening 10H of the display panel 10.

The opening area RA may correspond to a location where the electronic element 20 is arranged, and the electronic element 20 may therefore be arranged to correspond to the first through third openings 100H, 200H, and 300H of the substrate 100, the display element layer 200, and the thin film encapsulation layer 300. The first opening 100H may pass through upper and lower surfaces of the substrate 100, and the second opening 200H may pass through a lowermost layer up to an uppermost layer of the display element layer 200. The third opening 300H may pass through the third opening 300H.

The electronic element 20 may be an electronic element that detects and/or produces light and/or sound. For example, the electronic element may include a sensor that receives light, such as an infrared sensor, a camera receiving light to capture an image, a sensor measuring a distance or sensing a fingerprint by outputting or sensing light or sound, a compact lamp outputting light, a speaker outputting sound, and the like. An electronic element detecting and/or producing light may use light of various wavelength bands such as visible light, infrared light, and/or ultraviolet light. The opening area RA may be understood as a transmission area through which light and/or sound that are output from the electronic element 20 to the outside or that travel from the outside into the electronic element 20 may be transmitted. As illustrated in FIG. 2A, when all portions of the display panel 10 corresponding to the opening area RA are removed, for example, when the opening 10H passes through the display panel 10, light or sound output or received by the electronic element 20 may be handled more effectively.

While FIG. 2A illustrates that the electronic element 20 is arranged below the substrate 100, the present disclosure is not limited thereto. According to an exemplary embodiment of the present disclosure, the electronic element 20 may be located within the opening 10H of the display panel 10.

FIG. 2A illustrates the substrate 100, the display element layer 200, and the thin film encapsulation layer 300 respectively including the first through third openings 100H, 200H, and 300H corresponding to the opening area RA. However, in FIG. 2B, the substrate 100 might not include the first opening 100H. For example, there may be no opening in the substrate 100 corresponding to the electronic element 20.

Figure 2B:
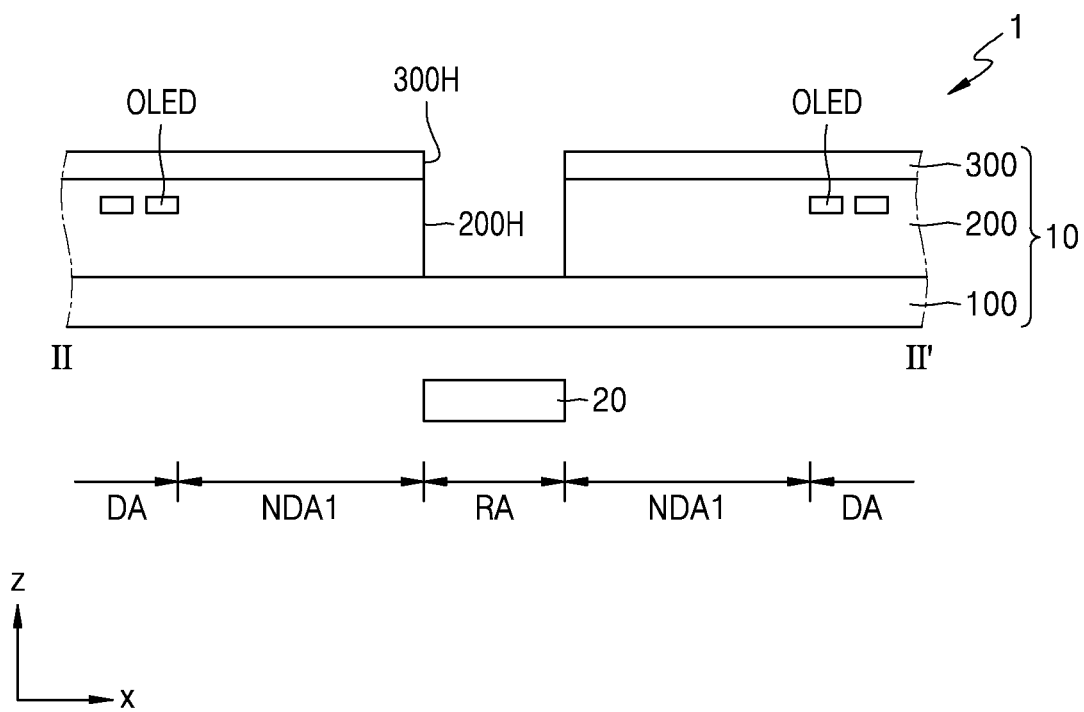

Referring to FIG. 2B, while the substrate 100 does not include a first opening, the display element layer 200 and the thin film encapsulation layer 300 may respectively include the second and third openings 200H and 300H, and thus, a transmittivity of light used by the electronic element 20 may be secured. According to an exemplary embodiment of the present disclosure, a light transmittivity in the opening area RA of the display panel 10 illustrated in FIG. 2B may be about 50% or higher, more preferably, 70% or higher, 75% or higher, 80% or higher, 85% or higher, or 90% or higher.

Figure 2C:
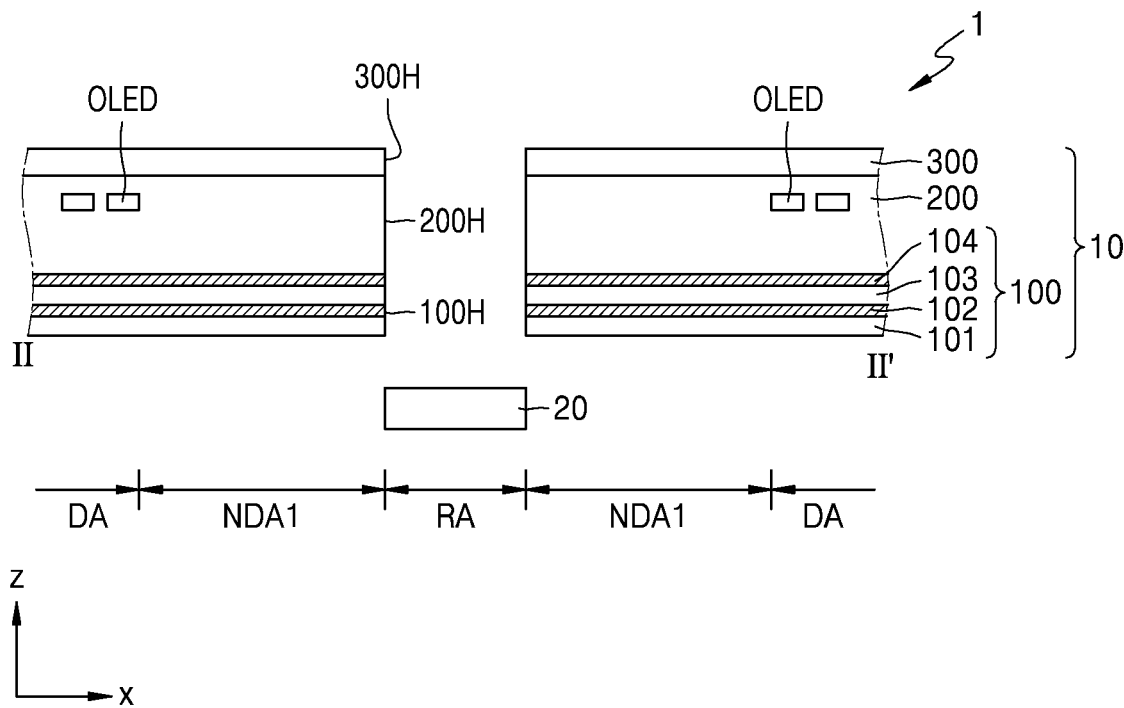
Figure 2D:
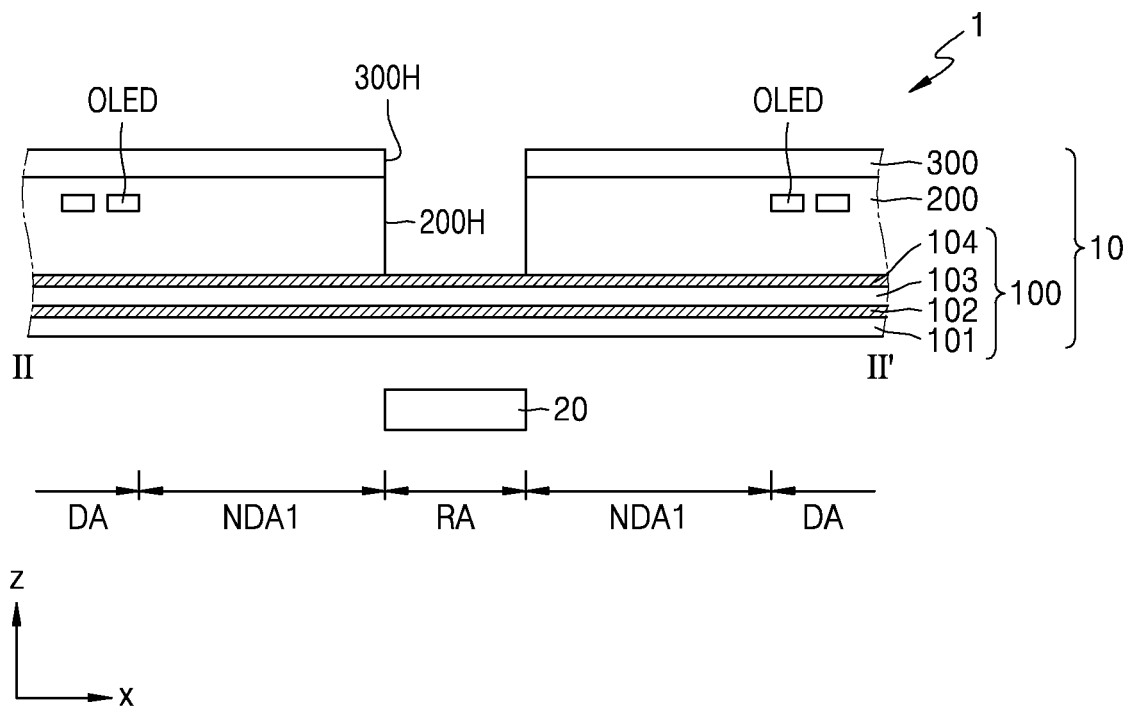

Referring to FIGS. 2C and 2D, the substrate 100 of the display panel 10 may include a polymer resin, thereby further providing flexibility as compared to a glass material substrate. For example, the substrate 100 may include a first base layer 101, a first inorganic layer 102, a second base layer 103, and a second inorganic layer 104 that are sequentially stacked.

The first and second base layers 101 and 103 may each include a transparent polymer resin. The polymer resin may be, for example, polyethersulfone (PES), polyarylate (PAR), polyetherimide (PEI), polyethyelene napthalate (PEN), polyethyelene terephthalate (PET), polyphenylene sulfide (PPS), polyimide (PI), polycarbonate (PC), cellulose triacetate (TAC), cellulose acetate propionate (CAP) or the like.

The first inorganic layer 102 and the second inorganic layer 104 are barrier layers preventing penetration of external foreign substances and each of these layers may be a single layer or a multilayer structure including an inorganic material, such as silicon nitride (SiNx) an/or silicon oxide (SiOx).

The substrate 100 including a polymer resin may include the first opening 100H corresponding to the opening region RA as shown in FIG. 2C or might not include a first opening as illustrated in FIG. 2D. Alternatively, as described above, the display element layer 200 and the thin film encapsulation layer 300 may have only the second and third openings 200H and 300H, respectively.

Figure 3:
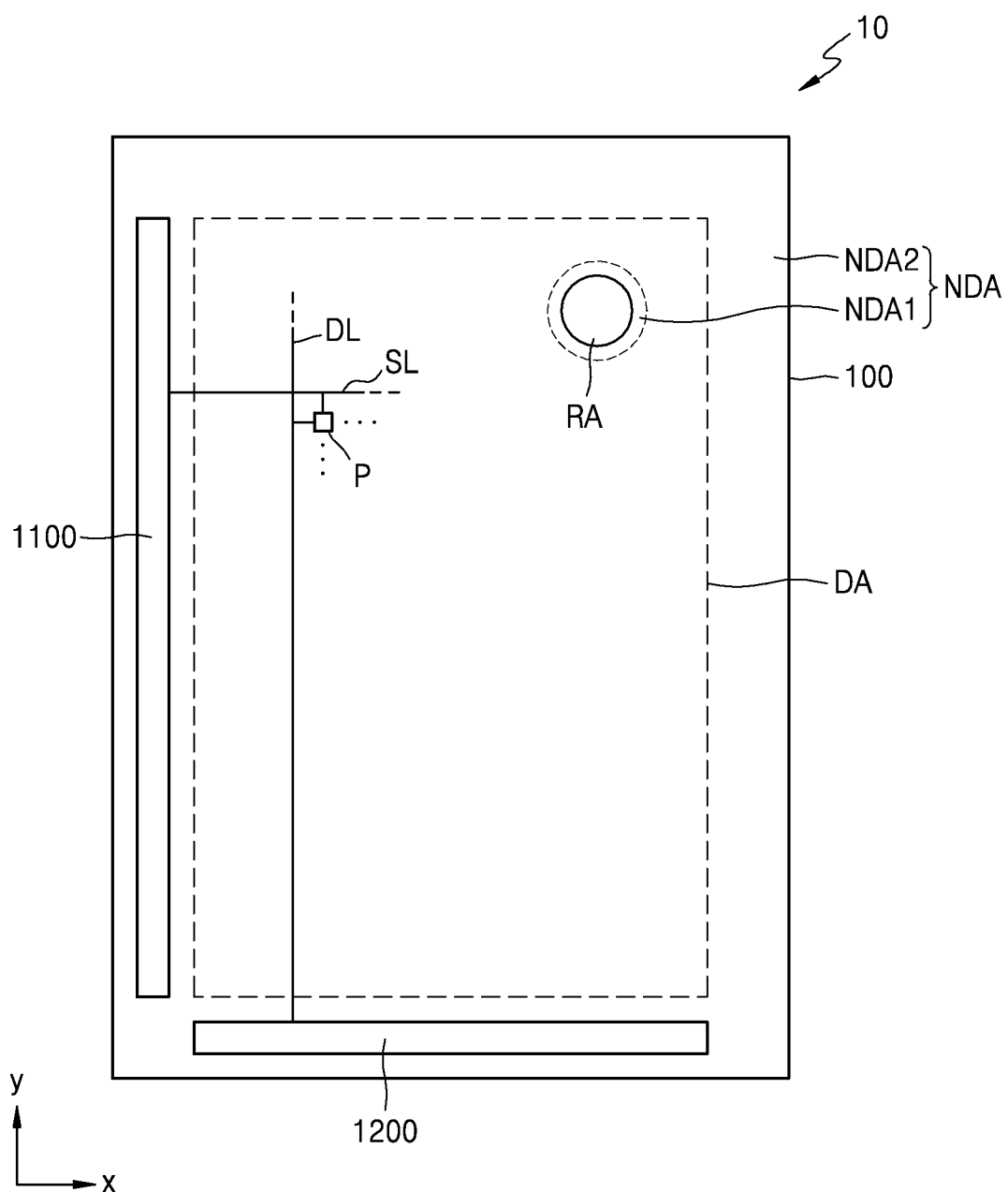
FIG. 3 is a schematic plan view illustrating a display panel according to an exemplary embodiment of the present disclosure.
Figure 4:
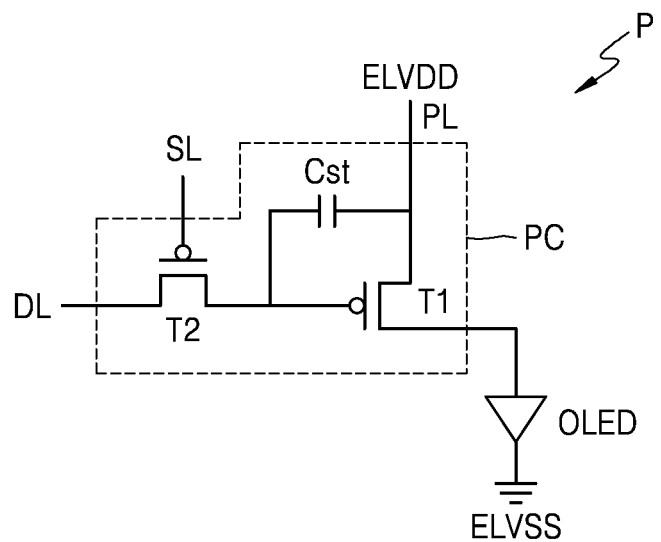
FIG. 4 is an equivalent circuit diagram schematically illustrating a pixel of a display panel according to an exemplary embodiment of the present disclosure.

FIG. 3 is a plan view schematically illustrating a display panel 10 according to an exemplary embodiment of the present disclosure, and FIG. 4 is an equivalent circuit diagram schematically illustrating a pixel of the display panel 10.

Referring to FIG. 3, the display panel 10 includes a plurality of pixels P arranged in a display area DA. Each of the pixels P may include an organic light-emitting diode OLED. Each pixel P may emit light of a red color, a green color, a blue color, or a white color, through the organic light-emitting diode OLED.

Referring to FIG. 4, each pixel P includes a pixel circuit PC and an organic light-emitting diode OLED connected to the pixel circuit PC. The pixel circuit PC may include a first thin film transistor T1, a second thin film transistor T2, and a storage capacitor Cst.

The second thin film transistor T2 is a switching thin film transistor and is connected to a scan line SL and a data line DL, and transfers a data voltage input via the data line DL according to a switching voltage input via the scan line SL, to the first thin film transistor T1. The storage capacitor Cst is connected to the second thin film transistor T2 and a driving voltage line PL, and stores a voltage corresponding to a voltage received from the second thin film transistor T2 and a first power voltage ELVDD supplied to the driving voltage line PL.

The first thin film transistor T1 is a driving thin film transistor and is connected to the driving voltage line PL and the storage capacitor Cst, and may control a driving current flowing through the organic light-emitting diode OLED from the driving voltage line PL, in accordance with a voltage value stored in the storage capacitor Cst. The organic light-emitting diode OLED may emit light having a predefined brightness via a driving current. An opposite electrode (for example, a cathode) of the organic light-emitting diode OLED may receive a second power voltage ELVSS.

FIG. 4 illustrates the pixel circuit PC including two thin film transistors and one storage capacitor, but the present disclosure is not limited thereto. It will be understood that the number of thin film transistors and the number of storage capacitors may be varied according to a design of the pixel circuit PC.

Referring back to FIG. 3, the first non-display area NDA1 may surround the opening area RA. The first non-display area NDA1 is an area where display elements such as organic light-emitting diodes are not arranged. Signal lines via which a signal is provided to pixels P included around the opening area RA or grooves, which are described in detail below, may be arranged in the first non-display area NDA1. In the second non-display area NDA2, a scan driver 1100 providing a scan signal to each pixel P, a data driver 1200 providing a data signal to each pixel P, a main power wiring via which first and second power voltages are provided, or the like may be arranged.

FIG. 3 may be understood to show the substrate 100 included in the display panel 10. For example, it may be understood that the substrate 100 includes the opening area RA, the display area DA, and the first and second non-display areas NDA1 and NDA2.

Figure 5:
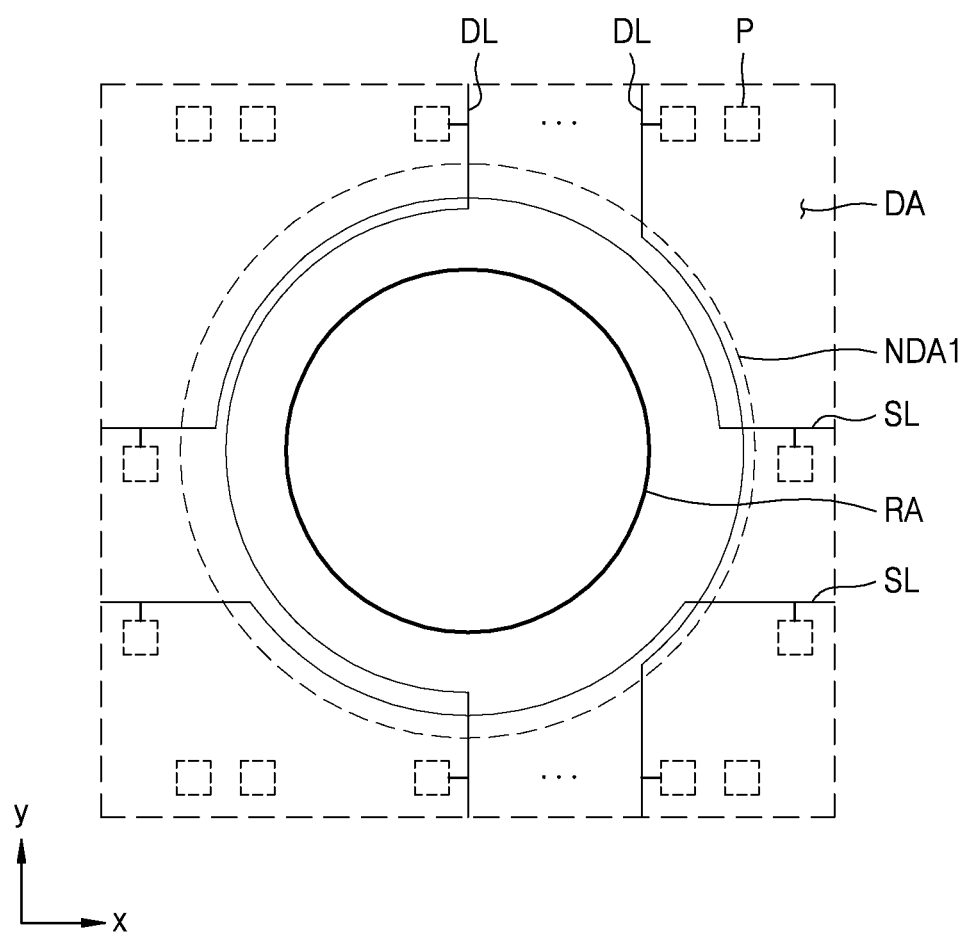
FIG. 5 is a plan view illustrating a portion of a display panel according to an exemplary embodiment of the present disclosure, and illustrating signal lines located in a first non-display area thereof.

FIG. 5 is a plan view illustrating a portion of a display panel according to an exemplary embodiment of the present disclosure, and FIG. 5 illustrates signal lines located in a first non-display area.

Referring to FIG. 5, pixels P are arranged in a display area DA around an opening area RA, and a first non-display area NDA1 may be arranged between the opening area RA and the display area DA.

The pixels P may be spaced apart from each other with respect to the opening area RA. The pixels P may be spaced apart from each other above and below the opening area RA with respect to the XY plane of FIG. 5. Alternatively, the pixels P may be spaced apart from each other on the left and on the right with respect to the opening area RA with respect to the XY plane of FIG. 5.

Signal lines that are used to supply a signal to the pixels P and are adjacent to the opening area RA may detour around the opening area RA. Some of data lines DL passing by the display area DA may extend in a y-direction to provide a data signal to the pixels P arranged above and below the opening area RA, and may detour along a boundary of the opening area RA in the first non-display area NDA1 at the same time. Some of scan lines SL passing by the display area DA may extend in an x-direction to provide a scan signal to the pixels P arranged on the left and right with respect to the opening area RA, and may detour along the boundary of the opening area RA in the first non-display area NDA1 at the same time.

Figure 6:
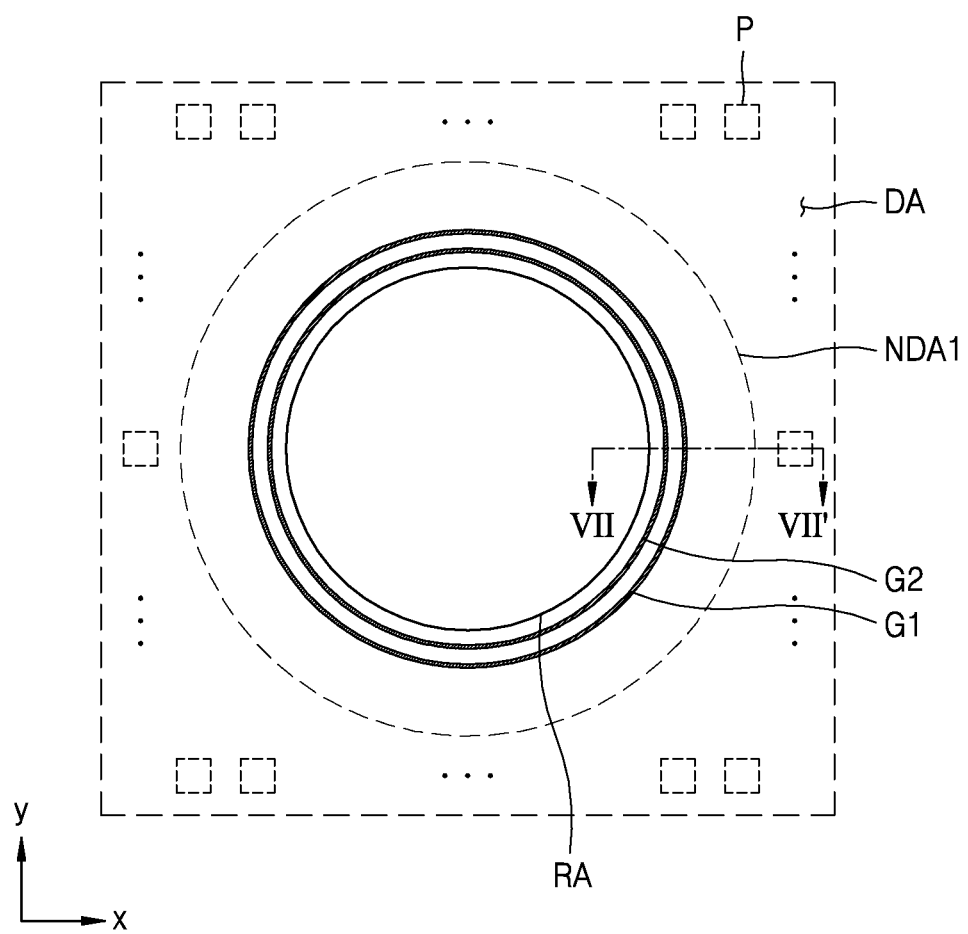
FIG. 6 is a plan view illustrating a portion of a display panel according to an exemplary embodiment of the present disclosure, and illustrating a groove located in a first non-display area thereof.

FIG. 6 is a plan view illustrating a portion of a display panel according to an exemplary embodiment of the present disclosure, and illustrates a groove located in a first non-display area.

A groove is located between the opening area RA and the display area DA, in this regard, while FIG. 6 illustrates first and second grooves G1 and G2 located between the opening area RA and the display area DA, according to an exemplary embodiment of the present disclosure, one or more grooves may be further included in addition to the first and second grooves G1 and G2.

The first and second grooves G1 and G2 may each have a ring shape that fully surrounds the opening area RA in the first non-display area NDA1. A diameter of each of the first and second grooves G1 and G2 may be greater than a diameter of the opening area RA, and the first and second grooves G1 and G2 may be spaced apart from each other by a predefined distance.

Figure 7:
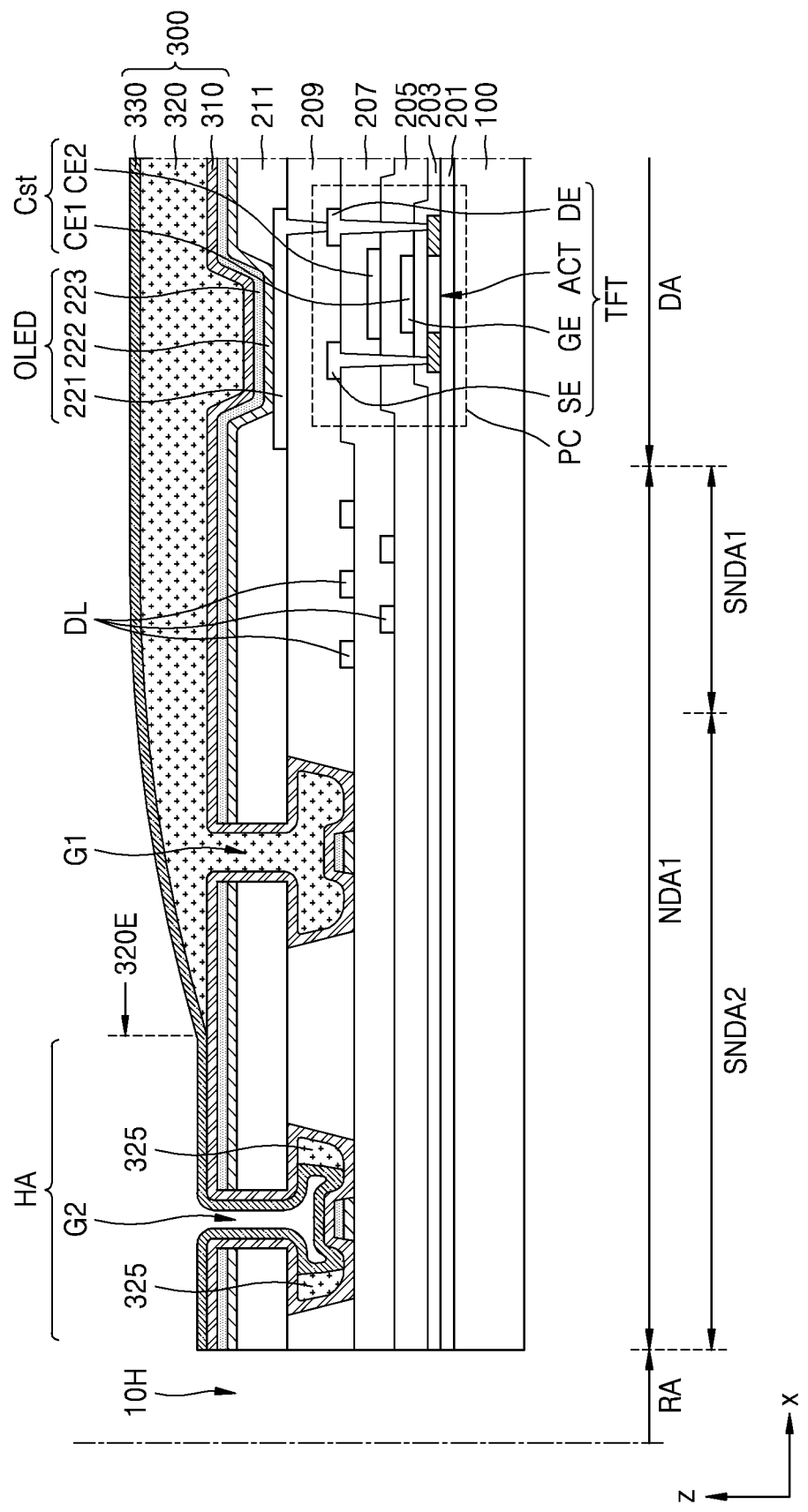
FIG. 7 is a schematic cross-sectional view illustrating a display panel according to an exemplary embodiment of the present disclosure.
Figure 8:
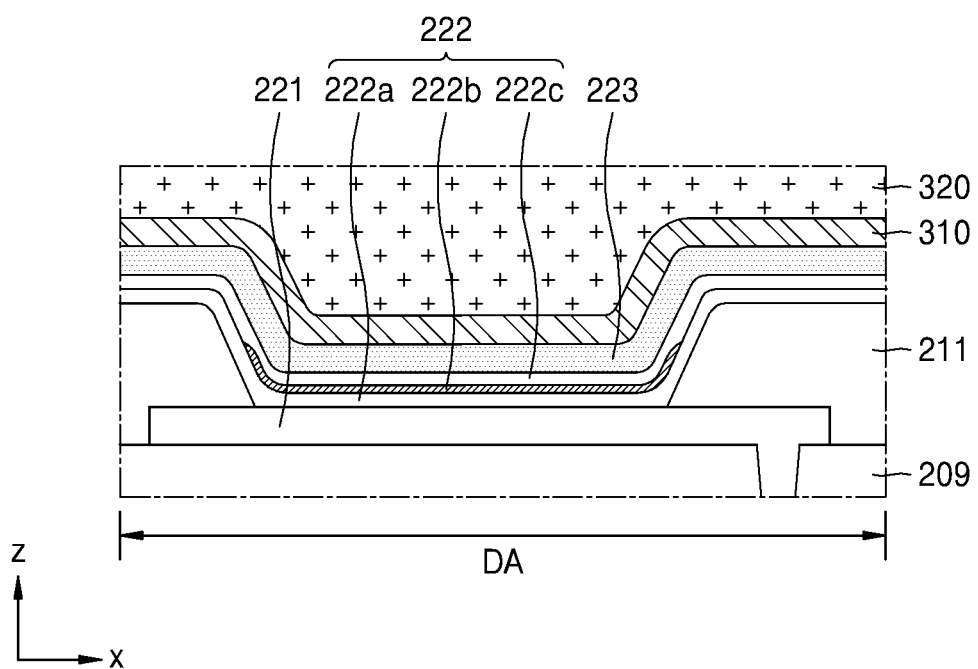
FIG. 8 is an enlarged cross-sectional view illustrating an organic light-emitting device of FIG. 7.
Figure 9A:
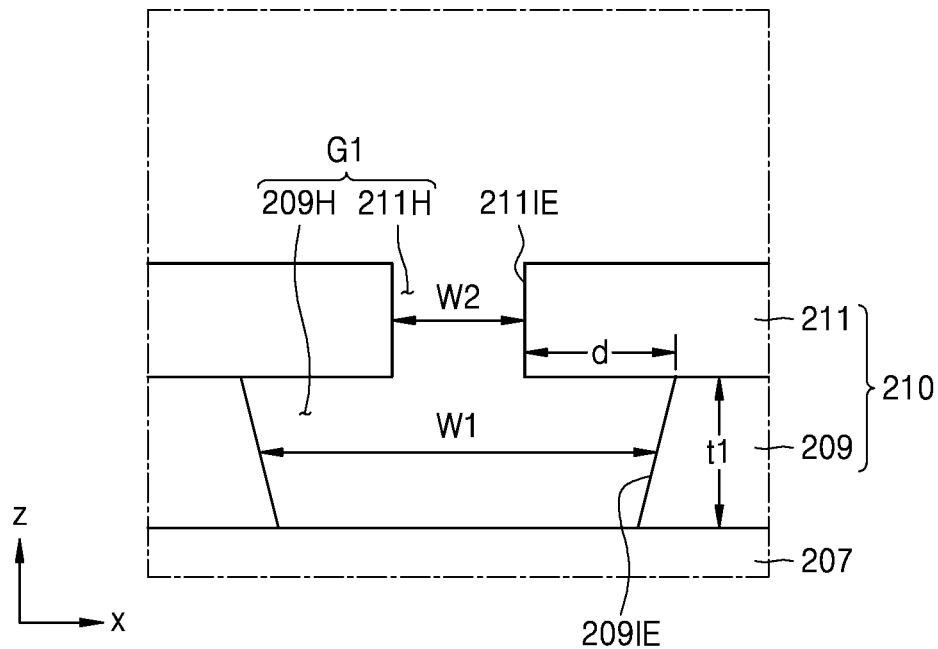
FIG. 9A is a breakout cross-sectional view illustrating a first groove.
Figure 9B:
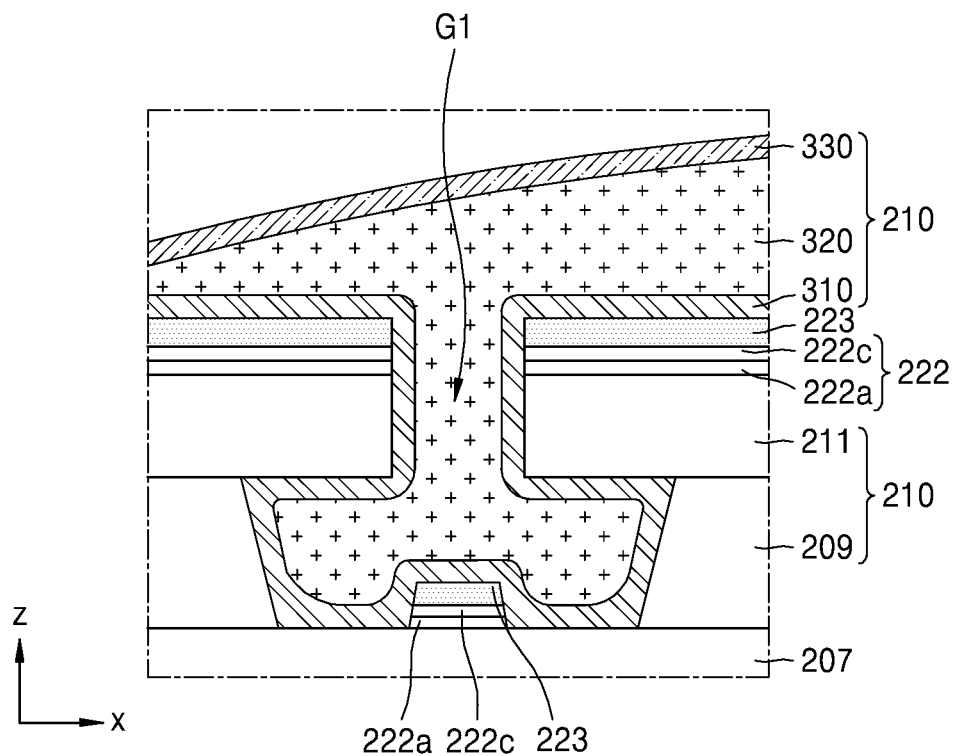
FIG. 9B is a cross-sectional view illustrating a stack structure on the first groove of FIG. 9A.

FIG. 7 is a cross-sectional view illustrating a display panel according to an exemplary embodiment of the present disclosure. FIG. 7 corresponds to a cross-section taken along a line VII-VII' of FIG. 6. FIG. 8 is an enlarged cross-sectional view illustrating an organic light-emitting device of FIG. 7. FIG. 9A is a cross-sectional view illustrating a breakout view of the first groove G1, and FIG. 9B is a cross-sectional view illustrating a stack structure on the first groove G1 of FIG. 9A.

First, referring to the display area DA shown in FIG. 7, the substrate 100 may include glass, as described above with reference to FIGS. 2A and 2B, or may include a base layer including a polymer resin, and an inorganic layer, as described above with reference to FIGS. 2C and 2D.

A buffer layer 201 may be formed on the substrate 100. The buffer layer 201 may prevent impurities from penetrating into a semiconductor layer of a thin film transistor. The buffer layer 201 may include an inorganic insulating material such as silicon nitride or silicon oxide, and may be a single layer or a multi-layer structure including the above-described inorganic insulating material. In some exemplary embodiments of the present disclosure, the second inorganic layer 104, described with reference to FIGS. 2C and 2D, may be understood as a sublayer of the buffer layer 201 having a multi-layer structure.

A pixel circuit PC including a thin film transistor TFT, a storage capacitor Cst, and the like may be arranged on the buffer layer 201. The thin film transistor TFT may include a semiconductor layer Act, a gate electrode GE, a source electrode SE, and a drain electrode DE. The thin film transistor TFT illustrated in FIG. 7 may correspond to the driving thin film transistor described with reference to FIG. 4. According to an exemplary embodiment of the present disclosure, a top gate type thin film transistor in which the gate electrode GE is arranged on the semiconductor layer Act with a gate insulating layer 203 included between the gate electrode GE and the semiconductor layer Act is illustrated. Alternatively, the thin film transistor TFT may also be a bottom gate type.

The semiconductor layer Act may include polysilicon. Alternatively, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like, and may be formed as a multi-layer or a single layer structure having the above-described material.

The gate insulating layer 203 may be interposed between the semiconductor layer Act and the gate electrode GE, and the gate insulating layer 203 may include a silicon oxide, a silicon nitride, a silicon oxynitride, an aluminum oxide, a titanium oxide, a tantalum oxide, a hafninum oxide or the like.

The source electrode SE and the drain electrode DE may each include a material having a high conductivity. The source electrode SE and the drain electrode DE may each include a conductive material such as molybdenum (Mo), aluminum (Al), copper (Cu), titanium (Ti), or the like, and may be formed as a multi-layer or a single layer structure having the above-described material. In one exemplary embodiment of the present disclosure, the source electrode SE and the drain electrode DE may each include a multi-layer of Ti/Al/Ti.

The storage capacitor Cst includes a lower electrode CE1 and an upper electrode CE2 which overlap each other with a first interlayer insulating layer 205 interposed therebetween. The storage capacitor Cst may overlap with the thin film transistor TFT. In this regard, FIG. 7 illustrates that the gate electrode GE of the thin film transistor TFT is the lower electrode CE1 of the storage capacitor Cst, but the present disclosure is not limited thereto. According to an exemplary embodiment of the present disclosure, the storage capacitor Cst might not overlap the thin film transistor TFT. The storage capacitor Cst may be covered with a second interlayer insulating layer 207.

The first and second interlayer insulating layers 205 and 207 may each include an inorganic insulating material such as a silicon oxide, a silicon nitride, a silicon oxynitride, an aluminum oxide, a titanium oxide, a tantalum oxide, a hafnium oxide or the like.

The pixel circuit PC including the thin film transistor TFT and the storage capacitor Cst is covered by the first insulating layer 209. The first insulating layer 209 is a planarization insulating layer and may include an organic insulating material such as a typical general-use polymer (e.g., polymethylmethacrylate (PMMA) or polystyrene (PS)), a polymer derivative having a phenol group, an acrylic polymer, an imide-based polymer, an aryl ether-based polymer, an amide-based polymer, a fluorine-based polymer, a p-xylene-based polymer, a vinyl alcohol-based polymer, and blends thereof. According to an exemplary embodiment of the present disclosure, the first insulating layer 209 may include polyimide. According to an exemplary embodiment of the present disclosure, the first insulating layer 209 may have a thickness of about 1.7 μm to about 2.4 μm.

An organic light-emitting diode OLED is arranged on the first insulating layer 209. A pixel electrode 221 of the organic light emitting diode OLED may be arranged on the first insulating layer 209 and may be connected to the pixel circuit PC through a contact hole of the first insulating layer 209.

The pixel electrode 221 may include a conductive oxide such as an indium tin oxide (ITO), an indium zinc oxide (IZO), a zinc oxide (ZnO), an indium oxide (In$_2$O$_3$), an indium gallium oxide (IGO) or an aluminum zinc oxide (AZO). According to an exemplary embodiment of the present disclosure, the pixel electrode 221 may include a reflective layer including silver (Ag), magnesium (Mg), aluminum (Al), platinum (Pt), palladium (Pd), gold (Au), nickel (Ni), neodymium (Nd), Iridium (Ir), chromium (Cr) or a compound thereof. According to an exemplary embodiment of the present disclosure, the pixel electrode 221 may further include a film formed of ITO, IZO, ZnO, or In$_2$O$_3$ on or under the above-described reflective layer.

The second insulating layer 211 may include an opening exposing an upper surface of the pixel electrode 221 and may cover edges of the pixel electrode 221. The second insulating layer 211 includes an inorganic insulating material. For example, the second insulating layer 211 may include a silicon oxide and/or a silicon nitride, and may be a single layer or a multi-layer structure. A thickness of the second insulating layer 211 may be smaller than a thickness of the first insulating layer 209.

The intermediate layer 222 includes an emissive layer 222b. The emissive layer 222b may include a polymer or a low-molecular-weight organic material emitting light of a predefined color. According to an exemplary embodiment of the present disclosure, the intermediate layer 222 may include a first functional layer 222a arranged under the emissive layer 222b and/or a second functional layer 222c arranged on the emissive layer 222b. The first functional layer 222a and the second functional layer 222c include an organic material.

The first functional layer 222a may be a single layer or a multi-layer structure. For example, when the first functional layer 222a is formed of a polymer material, the first functional layer 222a may be a hole transport layer (HTL) having a single-layer structure and may include poly-(3,4)-ethylene-dihydroxy thiophene (PEDOT) or polyaniline (PANI). When the first functional layer 222a is formed of a low-molecular-weight material, the first functional layer 222a may include a hole injection layer (HIL) and a hole transport layer (HTL).

The second functional layer 222c is optional and may be omitted. For example, when the first functional layer 222a and the emissive layer 222b are formed of a polymer material, the second functional layer 222c may be formed. The second functional layer 222c may be a single layer or a multi-layer stricture. The second functional layer 222c may include an electron transport layer (ETL) and/or an electron injection layer (EIL).

Some of the plurality of layers constituting the intermediate layer 222, for example, functional layer(s), may be arranged not only in the display area DA but also in the first non-display area NDA1, and these layers may be cut off in the first non-display area NDA1 by the first and second grooves G1 and G2 which will be described later.

The opposite electrode 223 is disposed to face the pixel electrode 221 with the intermediate layer 222 interposed therebetween. The opposite electrode 223 may include a conductive material having a low work function. For example, the opposite electrode 223 may include a transparent or semitransparent layer including Ag, Mg, Al, Pt, Pd, Au, Ni, Nd, Ir, Cr, lithium (Li), calcium (Ca) or an alloy thereof. Alternatively, the opposite electrode 223 may further include a layer such as ITO, IZO, ZnO or $In_2O_3$ on the transparent or semitransparent layer.

The organic light emitting diode OLED is covered by the thin film encapsulation layer 300. The thin film encapsulation layer 300 may include at least one organic encapsulation layer and at least one inorganic encapsulation layer. FIG. 7 illustrates that the thin film encapsulation layer 300 includes first and second inorganic encapsulation layers 310 and 330 and an organic encapsulation layer 320 interposed therebetween. Alternatively, a stacking order and a number of encapsulation layers may be varied.

The first and second inorganic encapsulation layers 310 and 330 may include an inorganic insulating material such as an aluminum oxide, a titanium oxide, a tantalum oxide, a hafnium oxide, a zinc oxide, a silicon oxide, a silicon nitride, and/or a silicon oxynitride, and may be formed by, for example, chemical vapor deposition (CVD). The organic encapsulation layer 320 may include a polymer-based material. Examples of the polymer-based material may include an acrylic resin, an epoxy resin, polyimide, and polyethylene.

Referring to the first non-display area NDA1 of FIG. 7, the first non-display area NDA1 may include a first sub-non-display area SNDA1 that is relatively far from the opening area RA and a second sub-non-display area SNDA2 that is relatively close to the opening area RA.

The first sub-non-display area SNDA1 is an area through which signal lines pass by, and data lines DL illustrated in FIG. 7 correspond to the data lines detouring the opening area RA described with reference to FIG. 5.

The data lines DL may be alternately arranged with an insulating layer interposed therebetween. Neighboring data lines DL may be respectively arranged under and over an insulating layer (e.g., the second interlayer insulating layer 207), thereby reducing a distance (pitch) between the adjacent data lines DL. When the distance (pitch) is reduced, a width of the first non-display area NDA1 may be reduced. Although only the data lines DL are illustrated in the first sub-non-display area SNDA1 in FIG. 7, the scan lines detouring the opening area RA described above with reference to FIG. 5 may also be formed in the first sub-non-display area SNDA1.

The second sub-non-display area SNDA2 may prevent penetration of external moisture proceeding in a lateral direction (x-direction) of the display element layer 200 through the opening 10H, and the first and second grooves G1 and G2 are arranged in the second sub-non-display area SNDA2.

Referring to FIG. 9A, the first groove G1 is formed in a multilayer film 210. Here, the multilayer film 210 may include a first insulating layer 209 as a lower insulating layer and a second insulating layer 211 as an upper insulating layer. Other insulating layers, for example, the buffer layer 201 through the second interlayer insulating layer 207, may be arranged under the multilayer film 210.

The first groove G1 may have a predefined depth along a thickness direction of the multilayer film 210. The first groove G1 may be formed by removing a portion of the second insulating layer 211 and a portion of the first insulating layer 209. The portion of the second insulating layer 211 and the portion of the first insulating layer 209 may be removed through an etching process. According to an exemplary embodiment of the present disclosure, an operation of etching the first insulating layer 209 to form a first hole 209H and an operation of etching the second insulating layer 211 to form a second hole 211H may be performed separately.

A first width W1 of the first hole 209H of the first insulating layer 209 may be greater than a second width W2 of the second hole 211H of the second insulating layer 211, and the first groove G1 may have an undercut structure in which a lower width is greater than an upper width thereof. In this regard, as illustrated in FIG. 9A, an internal side 211IE of the second insulating layer 211 facing the second hole 211H is protruded toward a center of the first groove G1 more by a first distance d in a lateral direction (x-direction) than an internal side 209IE of the first insulating layer 209. The first distance d may be smaller than a thickness t1 of the first insulating layer 209 or may be equal to or greater than the thickness t1 of the first insulating layer 209. The first distance d may be greater than a thickness of the first inorganic encapsulation layer 310 or than a sum of the thicknesses of the first and second inorganic encapsulation layers 310 and 330. According to an exemplary embodiment of the present disclosure, the first distance d may be about 2 µm or greater.

After forming the first groove G1 in the multilayer film 210 as illustrated in FIG. 9A, the intermediate layer 222 and the opposite electrode 223 are formed, and the intermediate layer 222 and the opposite electrode 223 may be cut (e.g. separated) by the first groove G1. In this regard, FIG. 9B illustrates that the first and second functional layers 222a and 222c and the opposite electrode 223 are cut by the first groove G1.

As illustrated in FIG. 9A, the intermediate layer 222 and the opposite electrode 223 are formed on the substrate 100 on which the first groove G1 is arranged. Some of a plurality of layers constituting the intermediate layer 222, for example, the first and/or second functional layers 222a and/or 222c may be integrally formed with the display area DA and the first non-display area NDA1 like the opposite electrode 223, and while the first groove G1 is formed in the first non-display area NDA1, the first and/or second functional layers 222a and/or 222c may be cut off with respect to the first groove G1. Likewise, the opposite electrode 223 is cut off with respect to the first groove G1.

The first inorganic encapsulation layer 310, from among the thin film encapsulation layer 300, has a better step coverage than the intermediate layer 222 and the opposite electrode 223, and thus, the first inorganic encapsulation layer 310 may completely cover an internal surface of the first groove G1 as illustrated in FIG. 9B. The first inorganic encapsulation layer 310 is continuously formed, as a singular structure, without being cut off by an undercut structure of the first groove G1. For example, the first inorganic encapsulation layer 310 may cover the internal side 211IE and a bottom surface of the second insulating layer 211 and a lateral surface and a bottom surface of the first insulating layer 209. Here, the first inorganic encapsulation layer 310 may be in direct contact with an upper surface of the second interlayer insulating layer 207 exposed through the first groove G1.

A layer including an organic material from among the layers formed on the substrate 100 may act as a transmission path for foreign substances such as moisture or oxygen. However, as the first insulating layer 209, which is an organic insulating layer, is cut off by the first groove G1, transmission of moisture in the lateral direction (x-direction) may be prevented. In addition, as the first inorganic encapsulation layer 310 is in direct contact with the second interlayer insulating layer 207, which is an inorganic insulating layer exposed through the first groove G1, as all layers including an organic material are covered, moisture transmission in the lateral direction through the layer(s) having an organic material may be prevented. Furthermore, as described above, since the first and/or second functional layers 222a and/or 222c may be cut off with respect to the first and second grooves G1 and G2, transmission of moisture in the lateral direction (x-direction) may be prevented.

A thickness of the first inorganic encapsulation layer 310, for example, a thickness thereof in a direction perpendicular to the substrate 100 (z-direction), may be smaller than the thickness t1 of the first insulating layer 209. A portion of the first groove G1 may be filled with the organic encapsulation layer 320 on the first inorganic encapsulation layer 310.

While FIGS. 9A and 9B illustrate a structure focused on the first groove G1, the second groove G2 may also have an identical structure to that of the first groove G1.

Referring to FIG. 7, the second groove G2 also has an undercut structure in which a lower width is greater than an upper width, and a detailed structure thereof is the same as that described above with reference to FIG. 9A. The intermediate layer 222 and the opposite electrode 223 may be cut off not only by the first groove G1 but also by the second groove G2. As described above with reference to the first groove G1, as an internal surface of the second groove G2 is fully covered by the first inorganic encapsulation layer 310 and the first inorganic encapsulation layer 310 directly contacts the second interlayer insulating layer 207 exposed through the second groove G2, a transmission path may also be effectively blocked by using an organic material also with respect to the second groove G2.

Unlike an upper portion of the first groove G1 where the first inorganic encapsulation layer 310 and the organic encapsulation layer 320 are, for example, in the second hole 211H of the second insulating layer 211, the organic encapsulation layer 320 may be omitted from the second groove G2.

The organic encapsulation layer 320 may be formed by applying, for example, a monomer on the substrate 100, and then hardening the same, and when the organic encapsulation layer 320 forms a lateral surface of the opening 10H, moisture transmission may occur through the organic encapsulation layer 320. In order to prevent this, a portion of the organic encapsulation layer 320, for example, a portion corresponding to an area HA between the opening area RA and the first groove G1 may be removed by ashing or the like, and accordingly, an end 320E of the organic encapsulation layer 320 may be arranged between the first groove G1 and the second groove G2. As the end 320E of the organic encapsulation layer 320 is arranged closer to the display area DA than ends of the first and second inorganic encapsulation layers 310 and 330 are, the first and second inorganic encapsulation layers 310 and 330 may directly contact each other in the area HA described above. For example, the first and second inorganic encapsulation layers 310 and 330 may also contact each other over an upper surface of the second insulating layer 211 and within the second groove G2.

Figure 10:
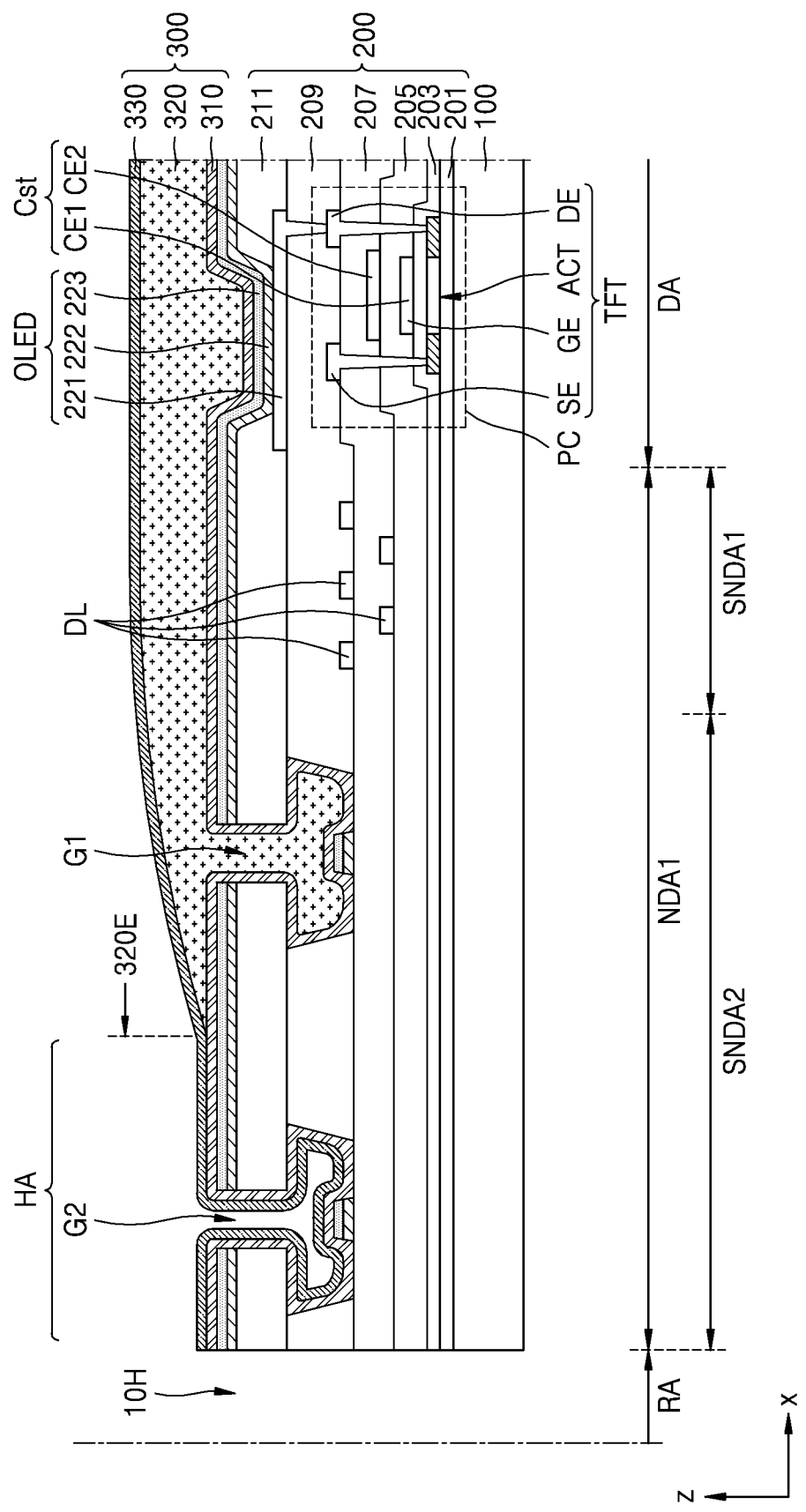
FIG. 10 is a schematic cross-sectional view illustrating a display panel according to an exemplary embodiment of the present disclosure.

During an operation of forming the organic encapsulation layer 320, when an organic material of the area HA is removed, the organic material existing in the second groove G2 is also removed in an ashing process. However, organic residue 325 may remain under the eaves (e.g. overhang) of the second insulating layer 211 in the undercut structure of the second groove G2. According to an exemplary embodiment of the present disclosure, according to conditions of the ashing process or the like, no organic residue may be left in the second groove G2 as illustrated in FIG. 10.

While FIGS. 7 through 10 illustrate a structure in which an opening is formed in the substrate 100, the present disclosure is not limited thereto as described above. The structures described with reference to FIGS. 7 through 10 and structures to be described below with reference to FIGS. 11 through 16 may also be applied to an exemplary embodiment in which an opening is not formed in the substrate 100, for example, to the display panel 10 illustrated in FIGS. 2B and 2D and embodiments derived therefrom.

Figure 11:
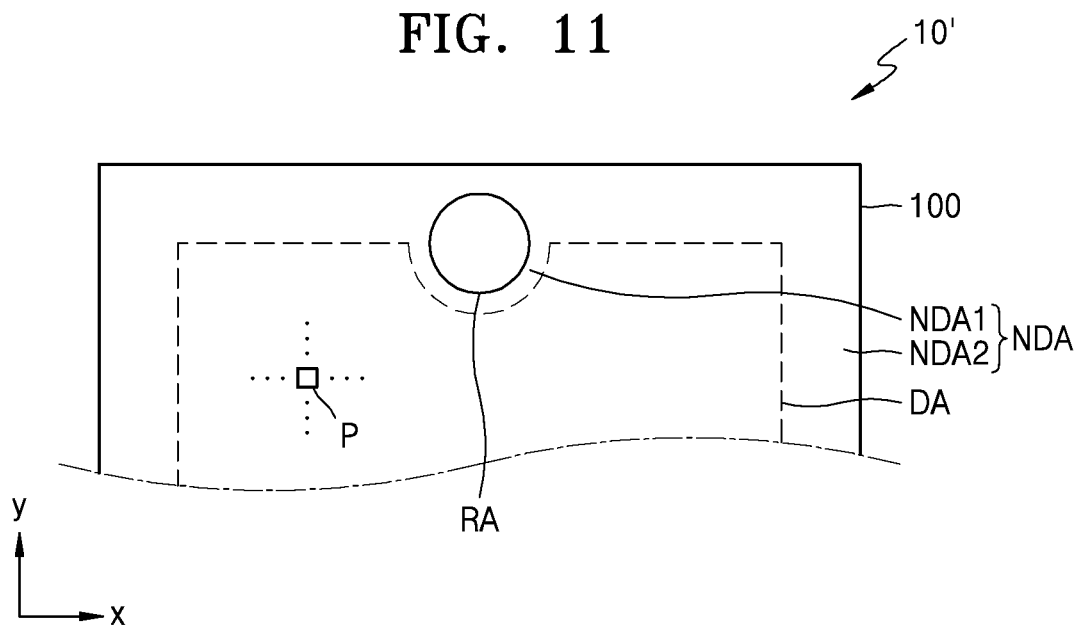
FIG. 11 is a schematic cross-sectional view illustrating a display panel according to an exemplary embodiment of the present disclosure.
Figure 12:
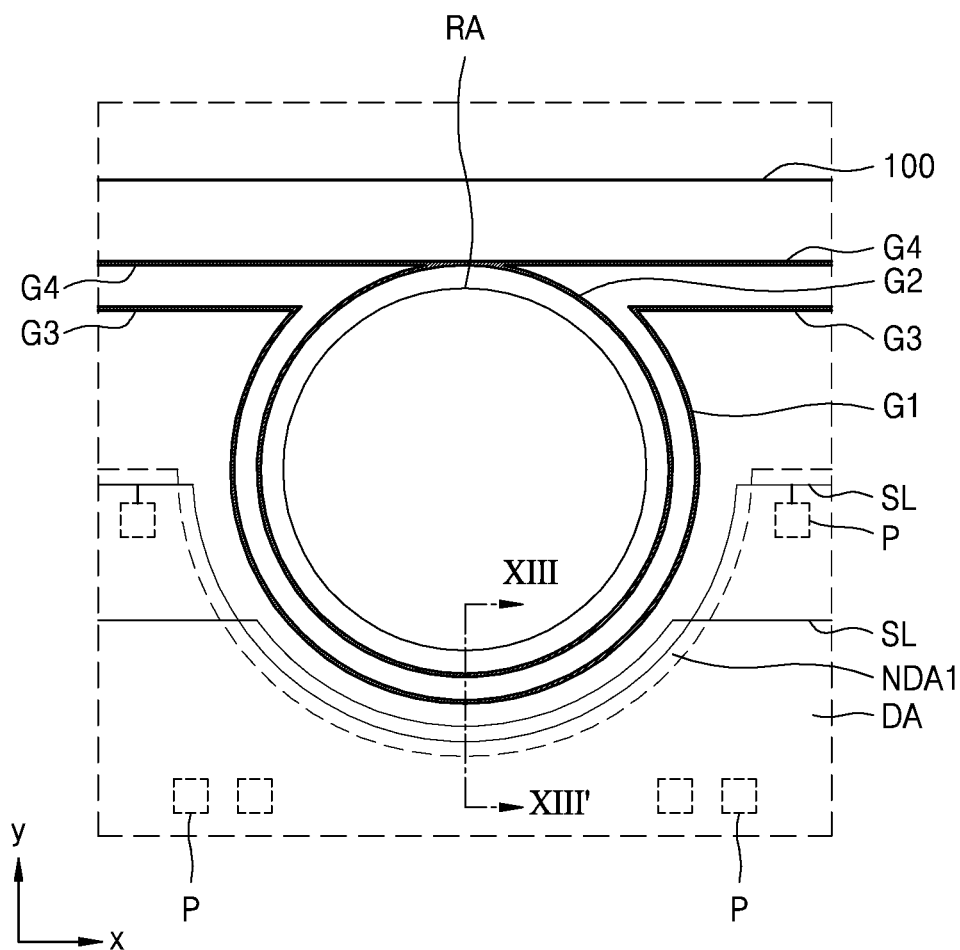
FIG. 12 is a plan view illustrating a peripheral area around an opening area.
Figure 13:
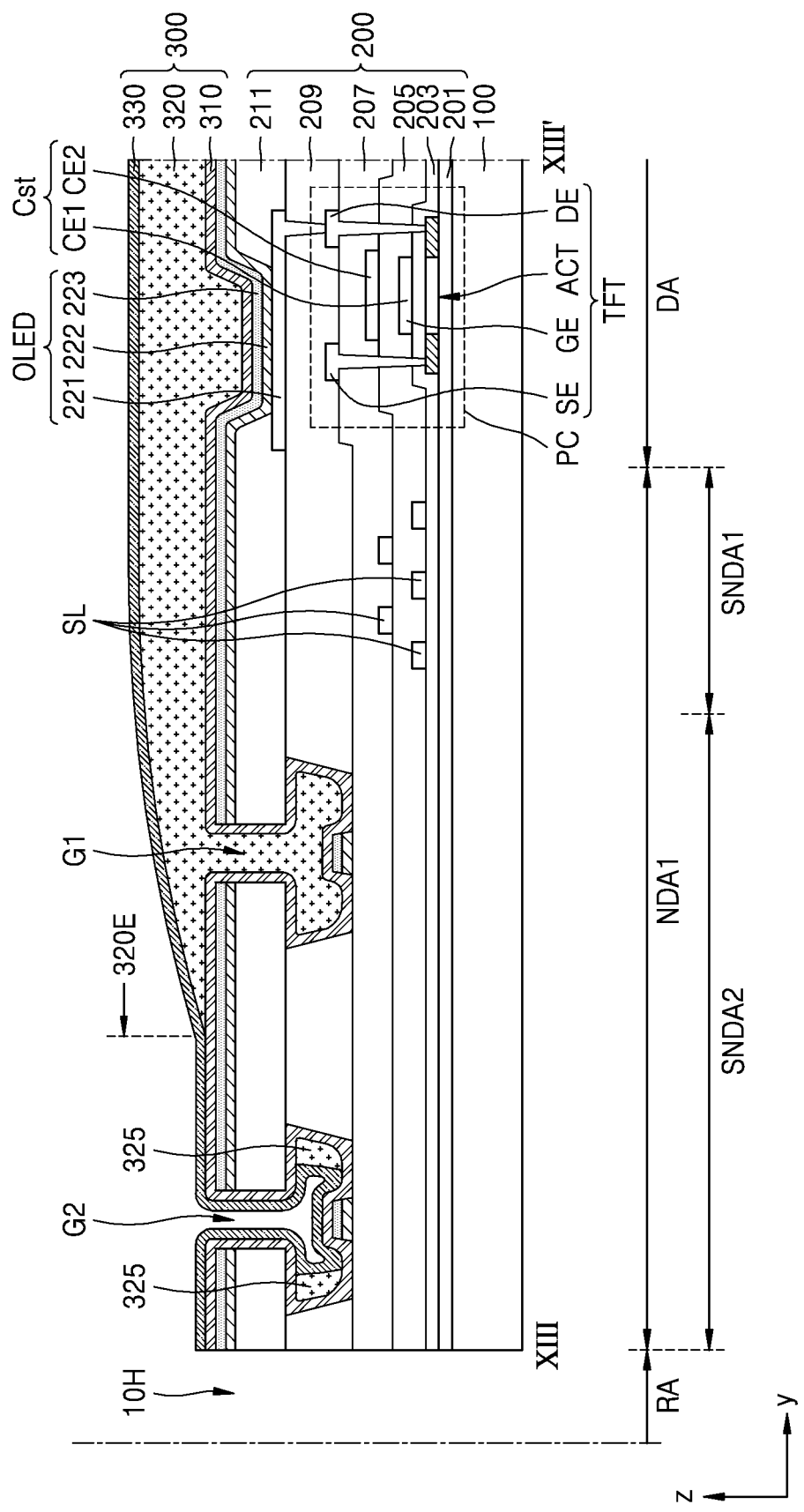
FIG. 13 is a cross-sectional view taken along a line XIII-XIII' of FIG. 12.

FIG. 11 is a cross-sectional view illustrating a display panel 10' according to an exemplary embodiment of the present disclosure. FIG. 12 is a plan view illustrating a peripheral area around an opening area RA of FIG. 11. FIG. 13 is a cross-sectional view illustrating the peripheral area around the opening area taken along a line XIII-XIII'. To the extent that a detailed description of elements and structure of the display panel 10' of the present embodiment are omitted, it may be assumed that the omitted details are at least similar to those of the display panel 10 described above with respect to FIG. 3.

Referring to FIGS. 11 and 12, an opening area RA of the display panel 10' may be partially surrounded by a display area DA. Pixels P may be spaced apart from each other on the left and right with respect to the opening area RA. A scan line SL transmitting a scan signal to a pixel P on the left side of the opening area RA and a pixel P on the right side of the opening area RA may detour around the opening area RA in the first non-display area NDA1.

The opening area RA may be surrounded, at least partially, by first and second grooves G1 and G2. According to an exemplary embodiment of the present disclosure, FIG. 12 illustrates that the first groove G1 surrounds a portion of the opening area RA, and the second groove G2 fully surrounds the opening area RA. The first groove G1 may surround a portion of the opening area RA, and two ends of the first groove G1 may be connected to a third groove G3 included in a second non-display area NDA2. The second groove G2 may fully surround the opening area RA and may be connected to a fourth groove G4 included in the second non-display area NDA2. The third and fourth grooves G3 and G4 may extend along a boundary of the substrate 100.

Scan lines SL of a first sub-non-display area SNDA1 illustrated in FIG. 13 correspond to scan lines detouring the opening area RA described above with reference to FIG. 12. The first and second grooves G1 and G2 are included between the scan lines SL and the opening area RA. To the extent that details concerning the arrangement of the first and second grooves G1 and G2 have been omitted, it may be assumed that the non-described details are at least similar to details of corresponding elements that have been described elsewhere within the specification.

Figure 14:
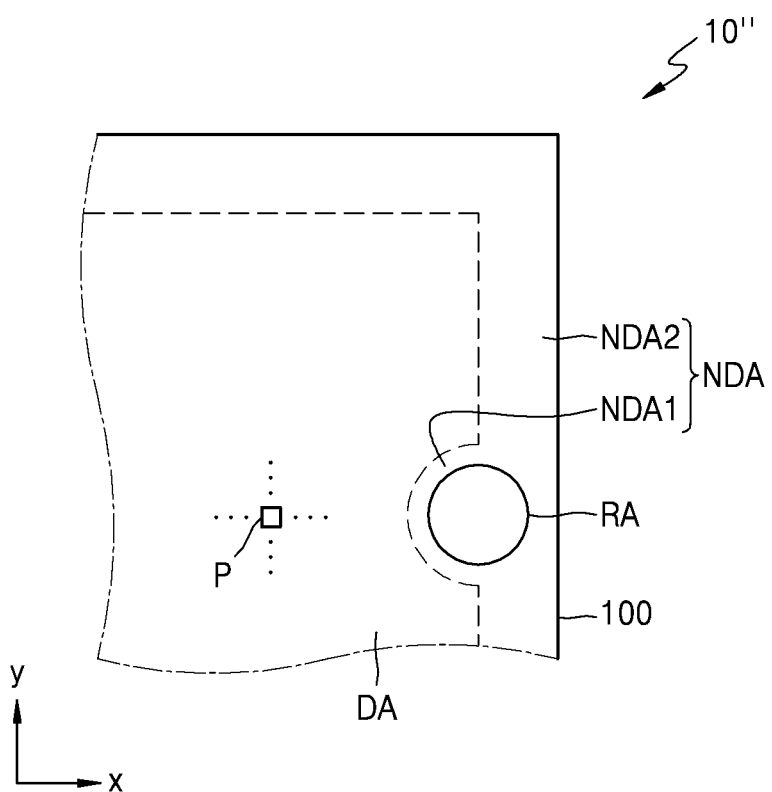
FIG. 14 is a schematic cross-sectional view illustrating a display panel according to an exemplary embodiment of the present disclosure.
Figure 15:
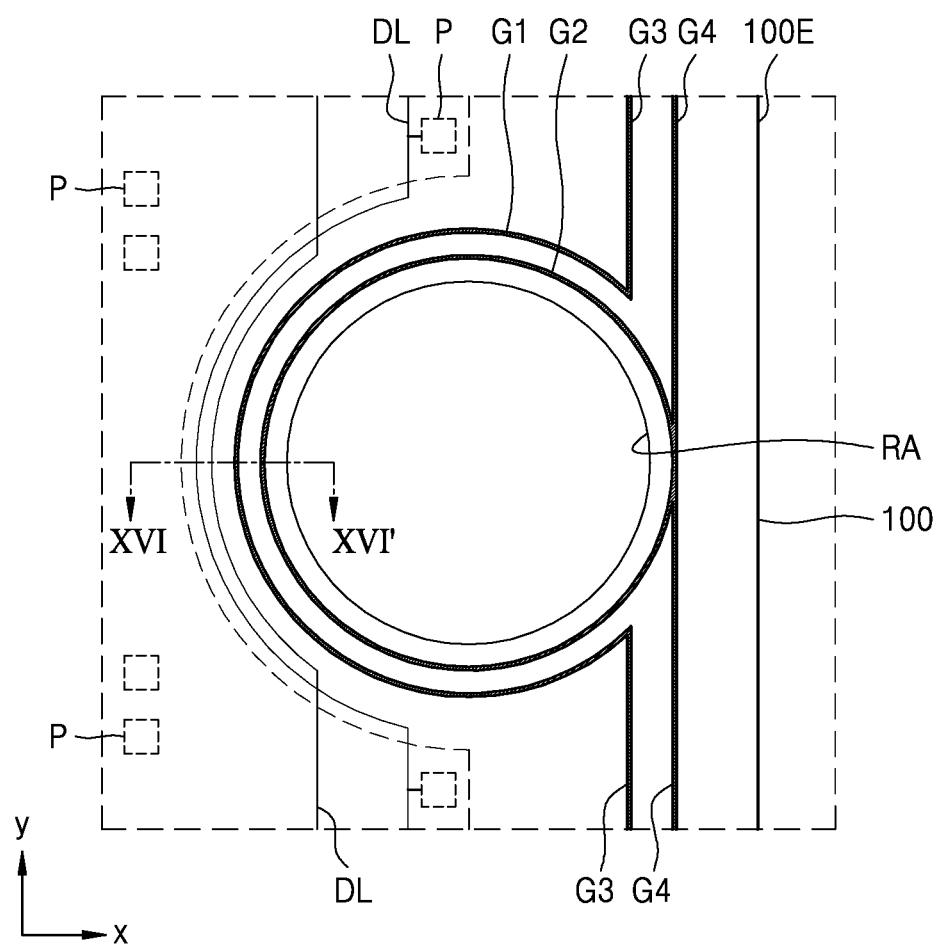
FIG. 15 is a plan view illustrating a peripheral area around an opening area.
Figure 16:
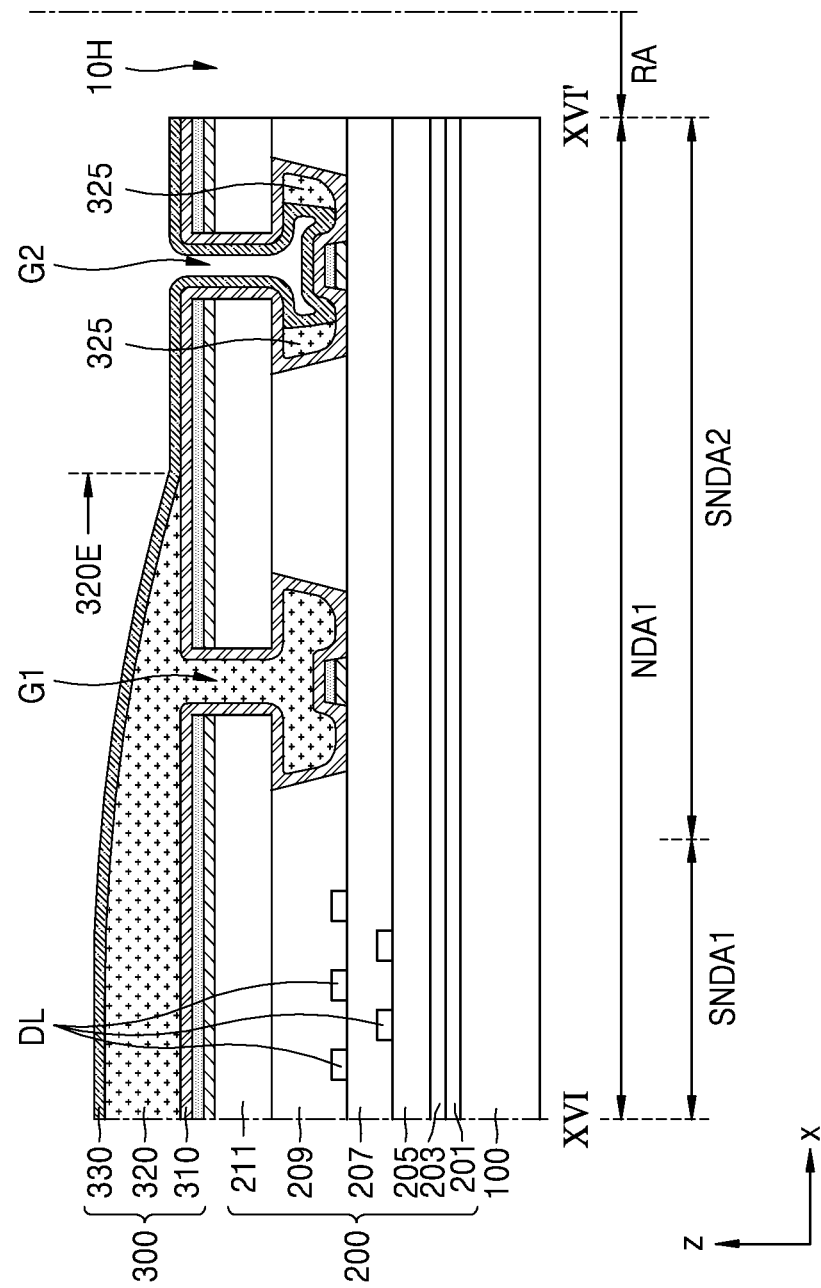
FIG. 16 is a cross-sectional view taken along a line XVI-XVI' of FIG. 15.

FIG. 14 is a cross-sectional view illustrating a display panel 10" according to an exemplary embodiment of the present disclosure. FIG. 15 is a plan view illustrating a peripheral area around an opening area RA of FIG. 14. FIG. 16 is a cross-sectional view illustrating the peripheral area around the opening area taken along a line XVI-XVI'. To the extent that a detailed description of particular elements and structures of the display panel 10" have been omitted, it may be assumed that the non-described elements and structures are at least similar to corresponding elements and structures of the display panel 10 that have been described with reference to FIGS. 3 through 10, elsewhere within the specification.

Referring to FIGS. 14 and 15, an opening area RA of the display panel 10" may be partially surrounded by a display area DA. Pixels P may be spaced apart from each other above and below with respect to the opening area RA with respect to the XY plane of FIGS. 14 and 15. A data line DL via which a data signal is transmitted to a pixel P above the opening area RA and a pixel P below the opening area RA may detour around the opening area RA in the first non-display area NDA1.

The opening area RA may be surrounded, at least partially, by the first and second grooves G1 and G2. According to an exemplary embodiment of the present disclosure, FIG. 15 illustrates that the first groove G1 surrounds a portion of the opening area RA, and the second groove G2 fully surrounds the opening area RA. The first groove G1 may surround a portion of the opening area RA, and two ends of the first groove G1 may be connected to a third groove G3 included in the second non-display area NDA2. The second groove G2 may surround the opening area RA and may be connected to a fourth groove G4 included in the second non-display area NDA2. The third and fourth grooves G3 and G4 may extend along a boundary of the substrate 100.

Data lines DL of a first sub-non-display area SNDA1 illustrated in FIG. 16 correspond to data lines detouring the opening area RA described above with reference to FIG. 15. The first and second grooves G1 and G2 are included between the data lines DL and the opening area RA. The structure of the first and second grooves G1 and G2 and elements around the first and second grooves G1 and G2 are at least similar to those described above.

Accordingly, to exemplary embodiments of the present disclosure, moisture transmission in a lateral direction toward display elements in an opening area may be effectively blocked and prevented through a groove that is formed in a multilayer film surrounding the opening area and has an undercut structure, and the prevention of moisture transmission may be achieved regardless of substrate types.

While various exemplary embodiments of the present disclosure have been described herein with reference to the figures, it will be understood by those of ordinary skill in the art that various changes in form and details may be made therein without departing from the spirit and scope of the present disclosure.

What is claimed is:

1. A display panel, comprising:
  a substrate having an opening;
  a plurality of light-emitting diodes arranged in a display area and surrounding the opening, the plurality of light-emitting diodes each comprising a first electrode, an light emitting layer on the first electrode, and a second electrode;
  a multilayer film comprising:
    a first layer between the substrate and the first electrode and comprising a first insulating material; and
    a second layer on the first layer,
    wherein the multilayer film comprises a first groove between the opening of the substrate and the display area, the first groove having a structure in which a lower width of the first groove is greater than an upper width of the first groove,
  an inorganic insulating layer under the first groove of the multilayer film; and
  an encapsulation layer covering the plurality of light-emitting diodes and the first groove.

2. The display panel of claim 1, wherein the encapsulation layer comprising a first inorganic encapsulation layer, an organic encapsulation layer, and a second inorganic encapsulation layer.

3. The display panel of claim 2, wherein the organic encapsulation layer covers the first groove and an edge of the organic encapsulation layer is located between the opening of the substrate and the first groove.

4. The display panel of claim 2, wherein the second inorganic encapsulation layer contacts an upper surface of the first inorganic encapsulation layer in a region between the first groove and the opening of the substrate.

5. The display panel of claim 2, wherein the multilayer film further comprises a second groove between the opening of the substrate and the first groove, and the second groove has a structure in which a lower width of the second groove is greater than an upper width of the second groove.

6. The display panel of claim 5, wherein:
  a residual material of the organic insulating material exists in the second groove.

7. The display panel of claim 6, wherein the residual material between a portion of the first inorganic encapsulation layer and a portion of the second inorganic encapsulation layer is enveloped by the portion of the first inorganic encapsulation layer and the portion of the second inorganic encapsulation layer.

8. The display panel of claim 1, wherein the first insulating material of the first layer comprises an organic insulating material.

9. The display panel of claim 1, wherein the second layer comprising a second material different from the first insulating material.

10. The display panel of claim 1, wherein the second material of the second layer comprises an insulating material.

11. The display panel of claim 10, wherein the second material of the second layer comprises an inorganic insulating material.

12. The display panel of claim 10, further comprising a functional layer between the first electrode and the second electrode, wherein the functional layer and the second electrode each cover the display area, and wherein each of the functional layer and the second electrode is separated by the first groove in a non-display area between the opening of the substrate and the display area.

13. The display panel of claim 12, wherein the functional layer comprises at least one selected from a hole transport layer, a hole injection layer, an electron transport layer, and an electron injection layer.

14. The display panel of claim 1, wherein the substrate comprises a glass or a polymer resin.

* * * * *